US011592883B2

United States Patent
Shih et al.

(10) Patent No.: US 11,592,883 B2
(45) Date of Patent: Feb. 28, 2023

(54) INFORMATION HANDLING SYSTEM THERMAL MANAGEMENT FOR DENSE STRUCTURES

(71) Applicant: Dell Products L.P., Round Rock, TX (US)

(72) Inventors: Pomin Shih, Beitou Dist. (TW); Travis C. North, Cedar Park, TX (US); Geroncio Tan, Austin, TX (US); Deeder M. Aurongzeb, Austin, TX (US); Salvador D. Jimenez, III, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 90 days.

(21) Appl. No.: 17/390,532

(22) Filed: Jul. 30, 2021

(65) Prior Publication Data

US 2023/0031055 A1    Feb. 2, 2023

(51) Int. Cl.
*G06F 1/20* (2006.01)
*H05K 7/20* (2006.01)
*G06F 1/16* (2006.01)

(52) U.S. Cl.
CPC ............ *G06F 1/203* (2013.01); *G06F 1/1635* (2013.01); *G06F 1/1662* (2013.01); *G06F 1/206* (2013.01); *H05K 7/20209* (2013.01); *H05K 7/20481* (2013.01)

(58) Field of Classification Search
CPC ...... G06F 1/203; G06F 1/1635; G06F 1/1662; G06F 1/206; H05K 7/20209; H05K 7/20481
See application file for complete search history.

(56) References Cited

U.S. PATENT DOCUMENTS

| 5,515,230 A | 5/1996 | Ashley |
| RE36,845 E | 8/2000 | Huppenthal et al. |
| 7,658,901 B2 | 2/2010 | Prud'Homme et al. |
| 7,841,897 B2 | 11/2010 | Blake et al. |
| 8,570,178 B2 | 10/2013 | Lawrence et al. |
| 8,587,945 B1* | 11/2013 | Hartmann ............... H01L 23/42 361/720 |
| 9,536,840 B2 | 1/2017 | Du |
| 9,624,379 B2 | 4/2017 | Do et al. |
| 9,640,531 B1 | 5/2017 | Or-Bach et al. |

(Continued)

OTHER PUBLICATIONS

Choi Yunhwa, Electronic control unit and manufacturing method, Jan. 27, 2021, English Translation of KR-20210010137-Ausing PE2E search (Year: 2021).*

*Primary Examiner* — Michael A Matey
(74) *Attorney, Agent, or Firm* — Zagorin Cave LLP; Robert W. Holland (57) ABSTRACT

Thermal management within an information handling system housing is provided by applying graphene paint to a support structure disposed within the housing, such as a battery casing that supports battery cells, a keyboard lattice that supports keyboard coupling to the housing and screws that attach components to the housing. The graphene paint may have different concentrations of graphene and/or different thicknesses so that the thermal characteristics of the support structure adapt to thermal generation within the housing, such as to keep an even distribution of temperatures within the housing.

17 Claims, 5 Drawing Sheets

(56) References Cited

U.S. PATENT DOCUMENTS

| | | | |
|---|---|---|---|
| 10,359,241 B2* | 7/2019 | Morrison | H05K 7/2039 |
| 11,122,710 B2* | 9/2021 | Jin | H05K 7/20472 |
| 2002/0061436 A1* | 5/2002 | Inagaki | H01M 10/0431 |
| | | | 429/176 |
| 2003/0066672 A1* | 4/2003 | Watchko | C23C 4/00 |
| | | | 174/50 |
| 2005/0111189 A1* | 5/2005 | Smalc | G06F 1/182 |
| | | | 257/722 |
| 2013/0209858 A1* | 8/2013 | Schmitt | H01M 10/64 |
| | | | 429/120 |
| 2014/0098502 A1* | 4/2014 | Lasarov | H04M 1/0283 |
| | | | 361/752 |
| 2014/0124176 A1* | 5/2014 | Zhamu | H01L 23/373 |
| | | | 165/133 |
| 2014/0126130 A1* | 5/2014 | Aurongzeb | H05K 5/0004 |
| | | | 361/679.02 |
| 2014/0192474 A1* | 7/2014 | North | G06F 1/203 |
| | | | 156/60 |
| 2014/0240921 A1* | 8/2014 | Sultenfuss | G06F 1/1656 |
| | | | 361/679.54 |
| 2015/0055300 A1* | 2/2015 | Hsieh | G06F 1/20 |
| | | | 165/104.26 |
| 2016/0007497 A1* | 1/2016 | North | G06F 1/203 |
| | | | 29/890.03 |
| 2016/0313771 A1* | 10/2016 | Simonson | H01G 11/78 |
| 2016/0334844 A1* | 11/2016 | Nguyen | H01L 23/552 |
| 2018/0152549 A1 | 5/2018 | Hobson et al. | |
| 2018/0199462 A1* | 7/2018 | Min | H05K 5/0086 |
| 2018/0218859 A1* | 8/2018 | Ligtenberg | H01H 13/86 |
| 2018/0277279 A1* | 9/2018 | Brereton | H02S 40/20 |
| 2019/0132940 A1* | 5/2019 | Sultenfuss | H05K 1/165 |
| 2020/0168572 A1 | 5/2020 | Lin et al. | |
| 2020/0388911 A1* | 12/2020 | Kim | H05K 3/4644 |
| 2021/0068244 A1* | 3/2021 | Jung | H05K 1/0231 |

* cited by examiner

INFORMATION HANDLING SYSTEM THERMAL MANAGEMENT FOR DENSE STRUCTURES

BACKGROUND OF THE INVENTION

Field of the Invention

The present invention relates in general to the field of portable information handling systems, and more particularly to an information handling system thermal management for dense structures.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems process information with processing components disposed in a housing. Desktop information handling systems tend to have larger stationary housings that provide room internally to distribute components for improved thermal and electromagnetic interference (EMI) management. Portable information handling systems integrate processing components, a display and a power source in a portable housing to support mobile operations that is typically smaller than a desktop system. Portable information handling systems allow end users to carry a system between meetings, during travel, and between home and office locations so that an end user has access to processing capabilities while mobile, such as in a tablet or convertible configuration. Tablet portable information handling systems typically expose a touchscreen display on a planar housing that both outputs information as visual images and accepts inputs as touches. Convertible portable information handling systems typically include multiple separate housing portions that couple to each other so that the system converts between closed and open positions. For example, a main housing portion integrates processing components and a keyboard and rotationally couples with hinges to a lid housing portion that integrates a display. In a clamshell position, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Portable information handling systems tend to have difficulty managing thermal conditions within low profile portable housings. Low profile housings have minimal internal space for transferring thermal energy from processing components to the air for rejection of the thermal energy out of the housing. For instance, minimal Z-height in the housing reduces the space between the components and housing surface so that a high airflow impedance reduces the mass flow of cooling air passing by the components, thereby reducing thermal energy transfer. Reduced thermal rejection tends to increase temperatures within the housing so that processing components that bump up against thermal constraints have to operate at lower power settings to reduce the amount of thermal energy released by the processing components. In addition, some components within the housing wear more quickly when operating at higher temperatures, such as batteries. In some instances, housings are themselves constructed of materials that absorb thermal energy that can then escape at the housing exterior. However, to reduce weight many information handling systems are built with plastic components that do not transfer thermal energy and, indeed, impede thermal rejection especially where low profile housings have dense internal structures.

SUMMARY OF THE INVENTION

Therefore, a need has arisen for a system and method which manages thermal energy in dense information handling system housing structures.

In accordance with the present invention, a system and method are provided which substantially reduce the disadvantages and problems associated with previous methods and systems for thermal management with information handling systems having dense internal structures. A structure disposed in an information handling system has graphene paint applied to help manage thermal energy within the information handling system housing, such as graphene paint applied to a battery casing and/or a keyboard lattice.

More specifically, an information handling system housing interior has a processor and memory that cooperate to process information and, as a result, generate thermal energy that tends to increase temperatures within the housing interior. To help remove the excess thermal energy, support structures within the housing interior have a graphene paint applied that absorbs thermal energy from the housing interior and distributes the thermal energy away from its source, such as away from a CPU or other, thereby providing a more even and reduced peak temperature throughout the housing. As an example, graphene paint may be applied to a keyboard lattice, a battery casing and/or coupling devices, such as screws. To achieve a desired thermal distribution in the housing, the graphene paint may have different concentrations of graphene and/or different thicknesses of paint. For instance, increased graphene concentrations and thicknesses may be applied in regions subjected to greater thermal energy creation, such as near a battery connector, over a battery cell or near a CPU or GPU.

The present invention provides a number of important technical advantages. One example of an important technical advantage is that an information handling system housing interior has improved thermal management with graphene paint applied to support structures so that excess thermal energy is better absorbed and dissipated. Varying graphene concentrations of the graphene paint and paint layer thickness helps to dissipate thermal energy to achieve a more even profile across the interior of the housing by concentrating graphene where thermal energy management is needed. In one example embodiment, applying graphene paint to a battery plastic support structure provided 1.5 degrees Celsius reduction in battery cell temperatures and a 1.7 degree temperature reduction between battery cells. In another example embodiment, graphene paint applied to a metal housing surface resulted in a 3.5 degree temperature reduction in the housing, which is equivalent to a 16% performance increase for the system processor. In an example embodiment having graphene paint applied to a keyboard lattice inner surface and a plastic housing bottom surface, a CPU temperature decrease of 1.5 degrees Celsius was provided, a 3.5 degree Celsius decrease in housing bottom surface temperature was provided, and a 2.7 degree Celsius decrease in keyboard lattice temperature was provided. These reductions in temperature translate to a greater available processing capability and/or a reduction in housing thickness and housing interior volume.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system manages thermal energy within a housing interior by applying graphene paint to support structures facing the housing interior, such as a battery casing and a keyboard lattice. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
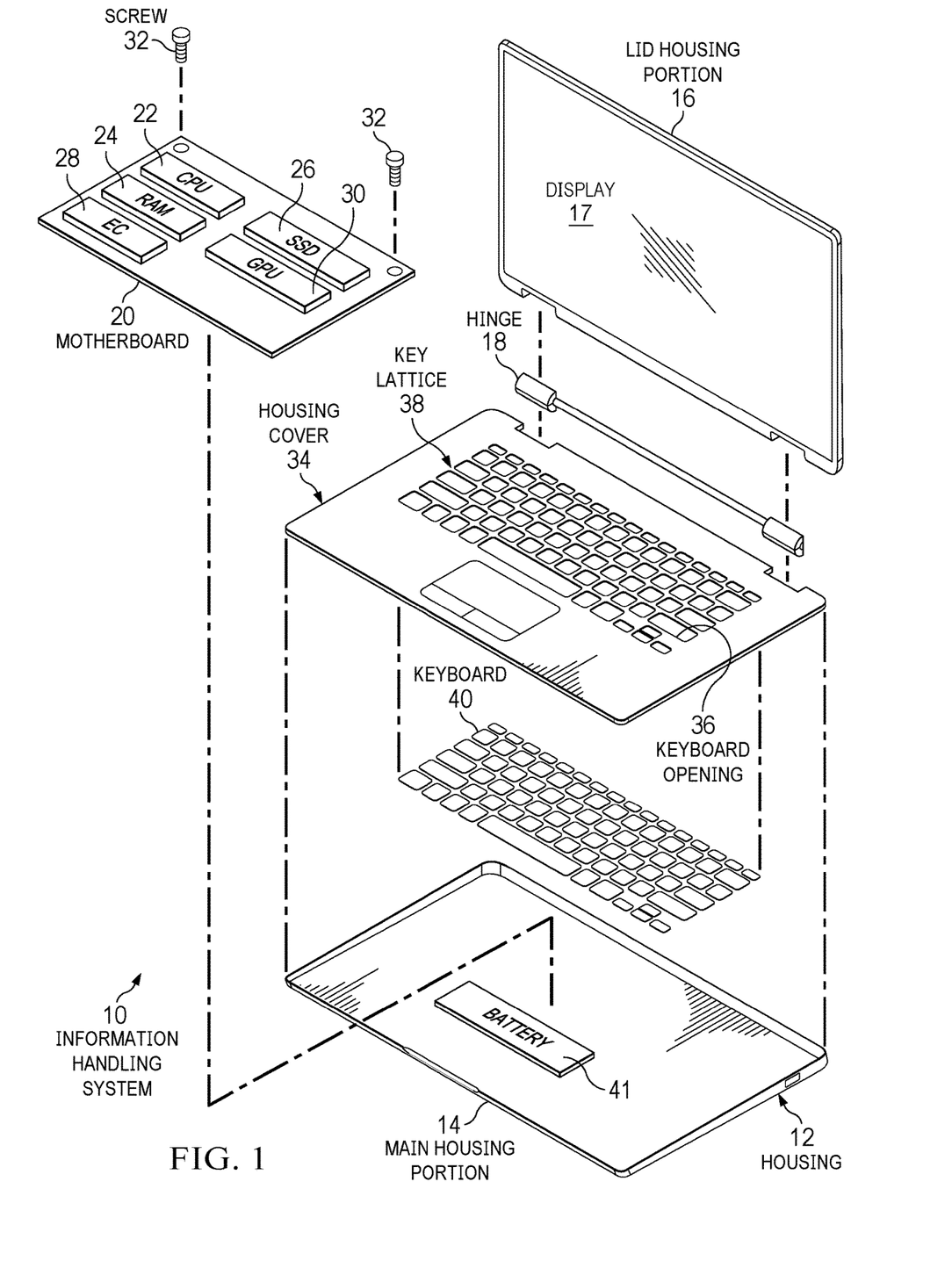
FIG. 1 depicts an exploded perspective view of an information handling system having support structures treated with graphene paint to help manage thermal energy in the housing interior.

Referring now to FIG. 1, an exploded perspective view depicts an information handling system 10 having support structures treated with graphene paint to help manage thermal energy in the housing interior. Information handling system 10 processes information with processing components disposed in a portable housing 12. In the example embodiment, portable housing 12 has a main housing portion 14, which holds processing components, rotationally coupled by a hinge 18 to a lid housing portion 16, which holds a display 17. The example embodiment provides a convertible system that rotates between open and closed positions, however, alternative embodiments may be a tablet configuration with a single planar housing portion or a non-mobile desktop housing. A motherboard 20 couples to main housing portion 14 with screws 32 or other coupling devices and provides communication between the processing components. For instance, a central processing unit (CPU) 22 executes instructions to process information with the instructions and information stored in a random access memory (RAM) 24. A solid state drive (SSD) 26 or other persistent storage device provides non-transient memory to store an operating system, applications and information when information handling system 10 is in a power down state. An embedded controller 28 manages physical device constraints for the system, such as the application of power and management of thermal constraints. For instance, embedded controller 28 may run a cooling fan that provides a cooling airflow through housing 12 to remove excess thermal energy or may throttle clock speeds of processing components to reduce the amount of thermal energy generated as a by-product of their operations. A graphics processor unit (GPU) 30 further processes information provided by CPU 22 to generate pixel values that define visual images for presentation at display 17. In alternative embodiments, various arrangements of these and other processing components may be used.

In the example embodiment, a housing cover 34 couples over main housing portion 14 to capture the processing components in an interior of housing 12. A keyboard 40 having plural keys inserts through a key lattice 38 having plural keyboard openings 36 to expose the keys at the housing exterior to accept end user key inputs. For example, embedded controller 28 interfaces with keyboard 40 to accept end user inputs. A battery 41 couples to the interior of housing 12 to provide stored battery charge to power the processing components. For instance, embedded controller 28 manages the application of power to run the processing components and process information. The interior of housing 12 in which the processing components run has a minimal height so that cooling of the processing components by air within housing 12 can prove insufficient for maintaining full power operations of the processing components. In such instances, embedded controller 28 slows the clock speeds of the processing components to help maintain thermal constraints.

In order to reduce the temperature within housing 12, a graphene paint is applied to support structures within housing 12 so that the graphene is available to absorb, spread and dissipate excess thermal energy. For instance, graphene paint is applied to a plastic casing that supports battery 41, key lattice 38 and screws 32, as well as any support structures that are exposed to thermal energy released within housing 12, such as the inner surface of housing cover 34 and the bottom surface of keyboard 40. Advantageously, graphene paint fills complex structural shapes with graphene that can then help to accept excess thermal energy. To achieve application of graphene paint on a support structure, once the support structure is formed, such as with machining or plastic molding, an argon cleaning of the surface is performed, a 5 micrometer thick spray of a 10% Nanoture and 10% graphene flake formulation is applied and then cured to 100 degrees Celsius, providing a polymer matrix of graphene with excellent thermal conductivity. In situations where a support structure has temperature limitations, such as may be the case with a battery, a lower cure temperature of 75 degrees Celsius may be used for a slightly longer time period of curing. Graphene paint is, for instance, a two-dimensional carbon nanometer material composed of carbon atoms with $SP^2$ hybrid orbital forming a hexagonal shape and honeycomb lattice with a size of between 5 and 50 nanometers. When applied as a paint, the graphene achieves thermal management at difficult to reach locations within the housing interior, such as complex shapes of keyboard ribbing, screw posts and hook structures that conventional graphene sheet heat spreaders cannot reach. Indeed, with complex and stepped structures found in some components, such as a battery casing, a gradient graphene paint thickness extends thermal dissipation into difficult to reach areas, and allows thermal absorption and dissipation at materials that have low thermal conductivity, such as plastic molded parts. Further, a thermal profile within a housing interior may be provided by selectively applying the graphene paint to achieve desired thermal characteristics. For instance, graphene paints of greater graphene concentration may be used for greater thermal conductivity. Similarly, thicker layers of graphene paint may be applied to increase thermal carrying absorption where greater amounts of thermal energy are present or are in need of dissipation.

Figure 2A:
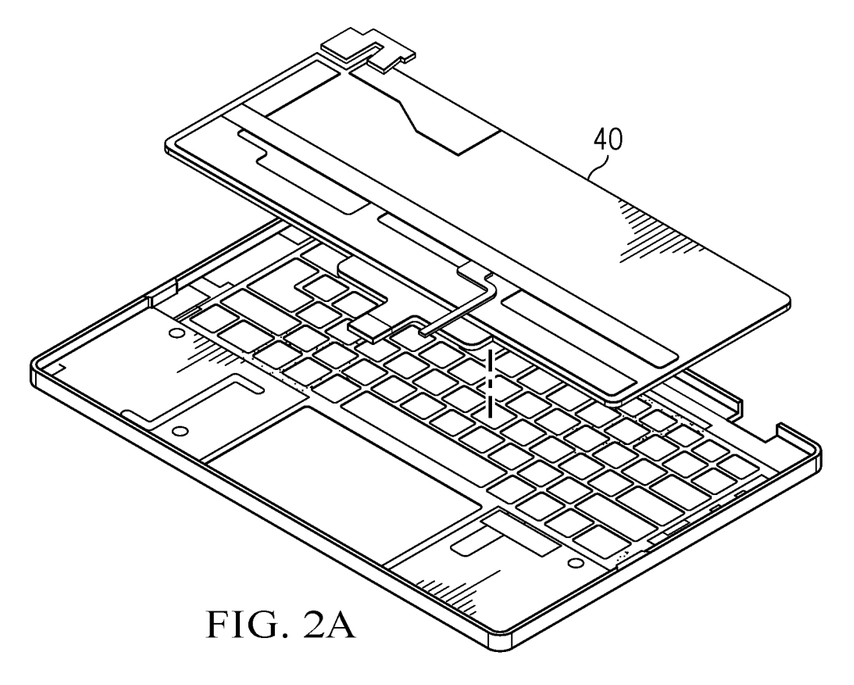
FIGS. 2A and 2B depict an example of a keyboard having a graphene paint applied to a lattice.
Figure 2B:
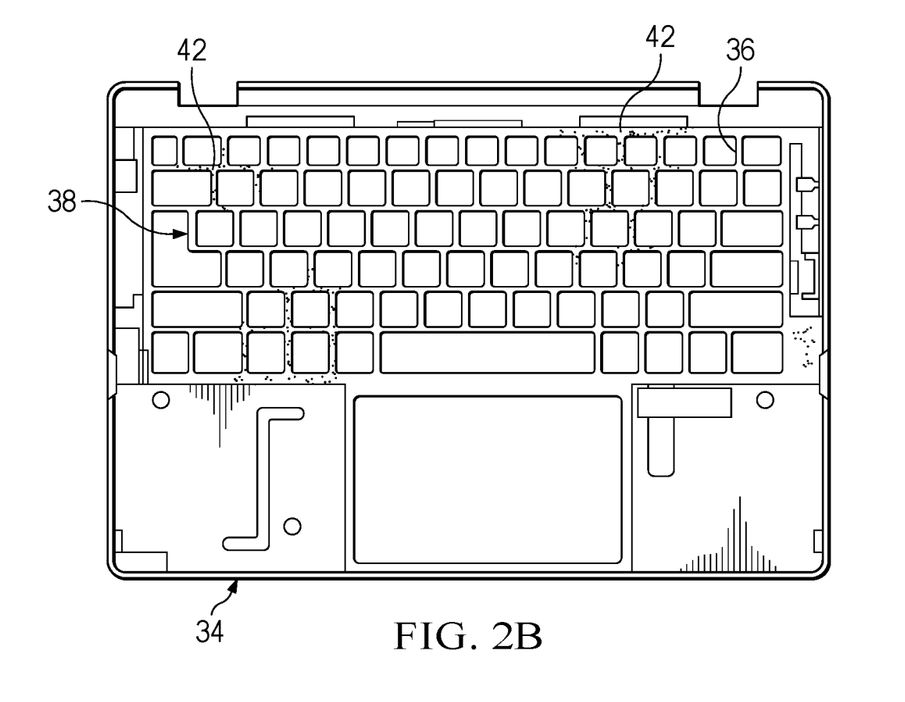

Referring now to FIGS. 2A and 2B, an example depicts a keyboard 40 having a graphene paint applied to a lattice 38 that defines key openings 36. In the example embodiment, housing cover 34 integrates lattice 38 to fit over keyboard 40 at the upper surface of the main housing portion. In alternative embodiments, lattice 38 may be a separate piece that, for instance, couples keyboard 40 into place at the upper surface of housing cover 34. Applying graphene paint 42 to lattice 38 adds a thermal management capability to a plastic molded piece that has a minimal footprint for providing thermal management. Thermal energy from within the housing is absorbed by graphene paint 42 to reduce the temperature within the housing and promote rejection of the thermal energy at the housing upper surface in a manageable way that does not produce excessive housing surface temperatures. FIG. 2A depicts a bottom perspective view of keyboard 40 aligned to have the keys extend through lattice 38. In one embodiment, the bottom surface of keyboard 40 may also have graphene applied to absorb thermal energy from within the housing interior, as may the bottom surface of housing cover 34. In one example embodiment, graphene paint applied at the various support structure surfaces varies in graphene concentration and/or thickness to distribute thermal energy in a desired manner. For example a palm rest area of housing cover 34 where an end user rests her palms while typing at keyboard 40 may have no graphene paint to avoid excess temperatures while an area near a hinge of the system may have extra amounts of graphene where an end user is less likely to contact the housing surface. Although the example embodiment addresses thermal energy at a keyboard, alternative embodiments may apply graphene paint in alternative housing support structures, such as the surface of the main housing portion and various brackets and coupling devices used to assemble components within the housing.

Figure 3:
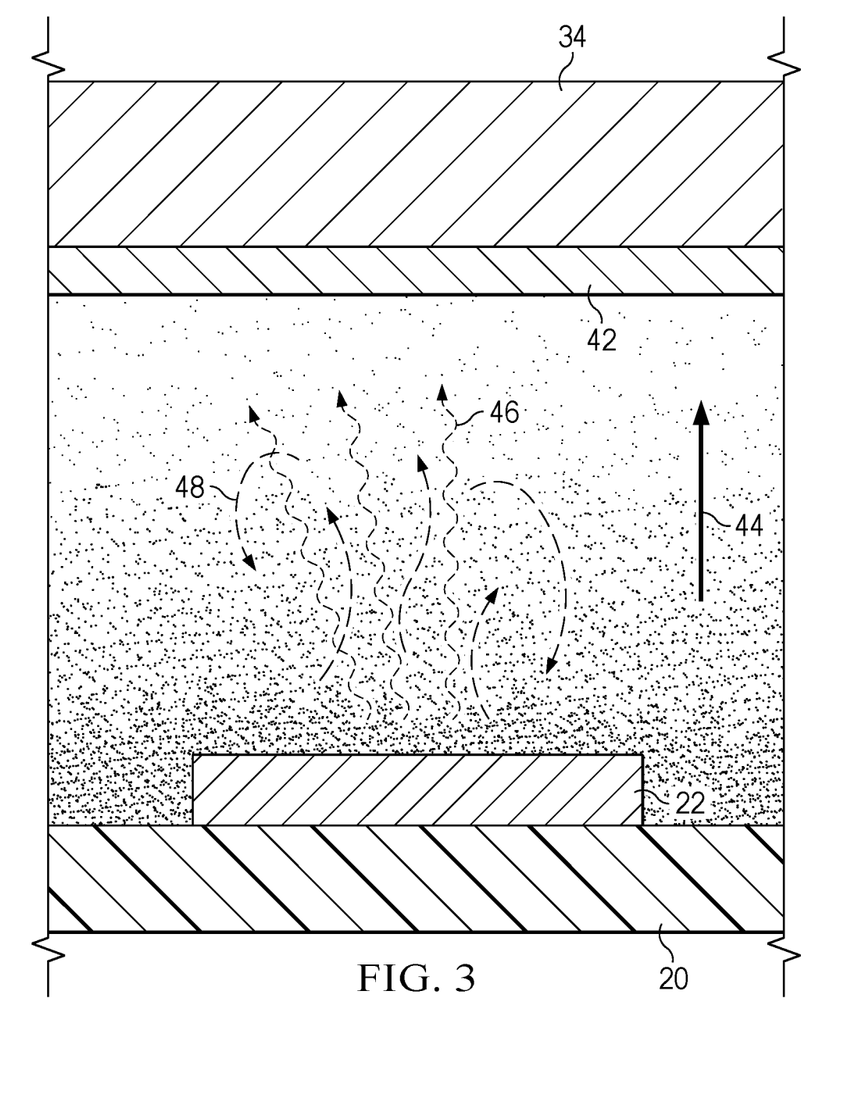
FIG. 3 depicts a side cutaway view of an information handling system interior illustrating thermal rejection enhanced by application of graphene paint.

Referring now to FIG. 3, a side cutaway view depicts an information handling system interior illustrating thermal rejection enhanced by application of graphene paint 42. The example embodiment depicts a motherboard 20 that supports a CPU 22, which generates thermal energy by dissipation of power to execute instructions. The thermal energy transfers to graphene paint 42 through air disposed within the housing cavity by conduction 44, radiation 46 and convection 48. Once thermal energy is absorbed by graphene paint 42, the high thermal conductivity of graphene promotes rapid spreading of the thermal energy for more even distribution across the surface of the housing. When housing cover 34 is a plastic material, graphene paint 42 enhances thermal absorption over the plastic material to help remove thermal energy from the air within the housing interior. When housing cover 34 is a metal material, graphene paint 42 spreads the thermal energy more rapidly to enhance thermal transfer to the metal material.

Figure 4:
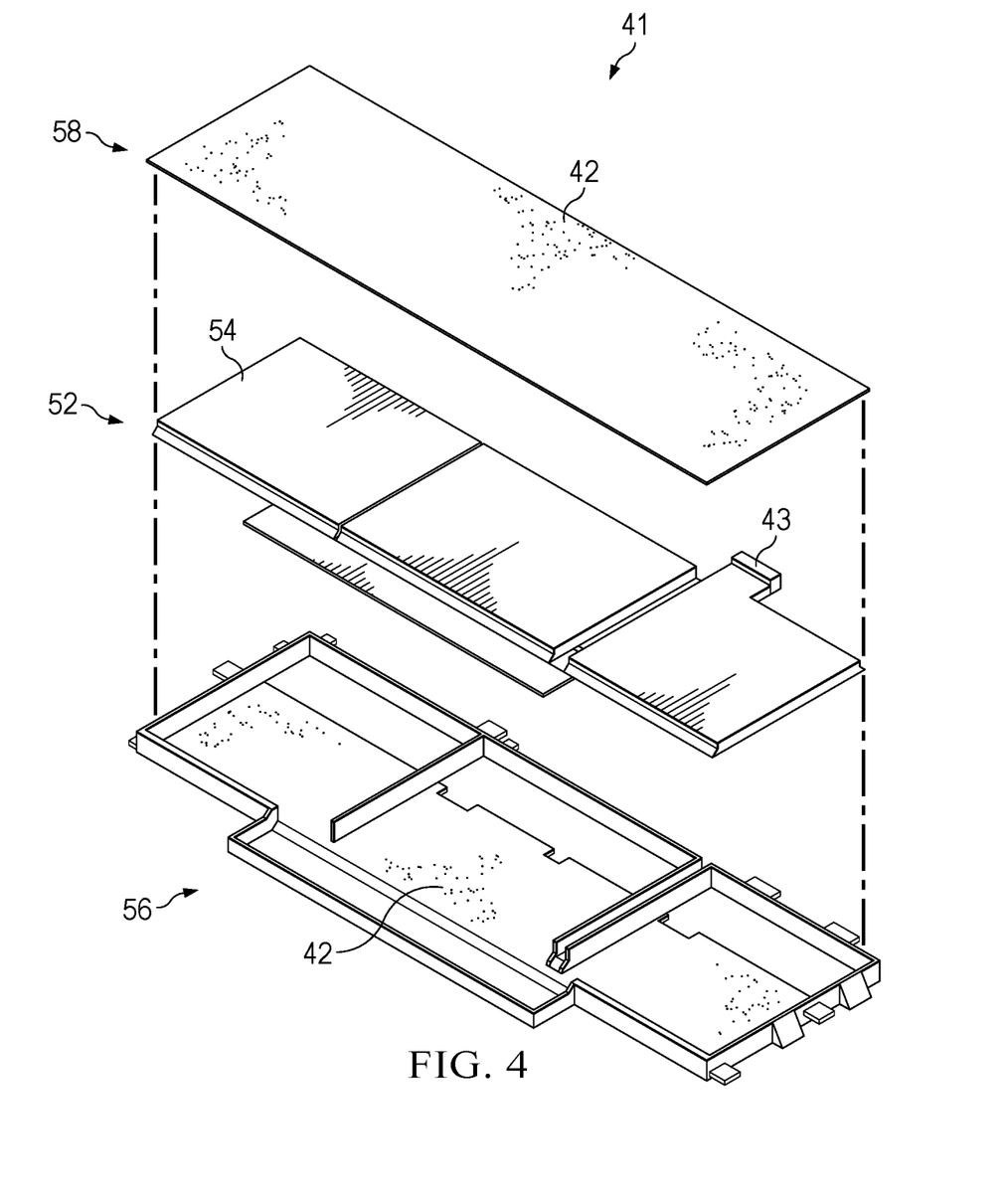
FIG. 4 depicts a perspective exploded view of a battery having graphene paint applied to a battery casing.

Referring now to FIG. 4, a perspective exploded view depicts a battery 41 having graphene paint 42 applied to a battery casing having an upper portion 58 and lower portion 56 that enclose battery cells 54 of a battery assembly 52. Graphene paint 42 is applied at the outer surface of the battery casing and/or the inner surface to absorb thermal energy associated with battery charge and discharge. In the example embodiment, casing upper portion 58 and lower portion 56 are molded plastic pieces that snap together around battery assembly 52 to protect battery cells 54. A battery connector 43 interfaces with a motherboard connector to provide an interface for accepting and releasing battery charge. In the example embodiment, thermal energy distribution during charge and discharge may have temperature extremes in particular areas, such as at connector 43 and at a central region of each battery cell 54. In order to provide a more even thermal profile of battery 41, graphene paint applied at the casing may include greater concentrations of graphene or greater thickness of paint where higher thermal conditions are expected, such as a central region of a battery cell 54 or at connector 43. In addition, thermal distribution may attempt to manage temperatures at external devices located near battery 41. For instance, graphene concentration and or graphene paint thickness may increase near components that generate heat, such as a CPU or memory, to help with distribution of that thermal energy to other parts of the battery casing. Alternatively, a greater concentration of graphene or thickness of graphene paint may be used distal external heat sources so that thermal energy is drawn from the proximity of the heat sources, such as away from the location of a CPU to a different area of the battery that is exposed to a cooling fan cooing airflow.

Figure 5:
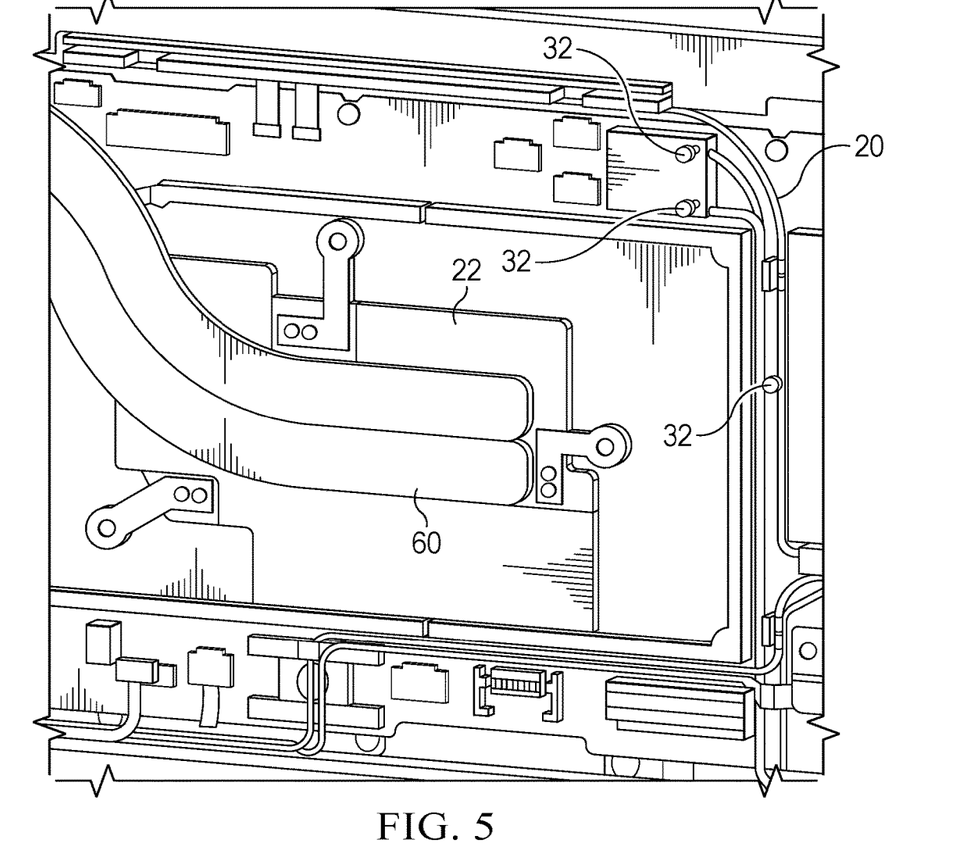
FIGS. 5 and 5A depict a support structure coupling device having a graphene paint applied to aid in thermal management.
Figure 5A:
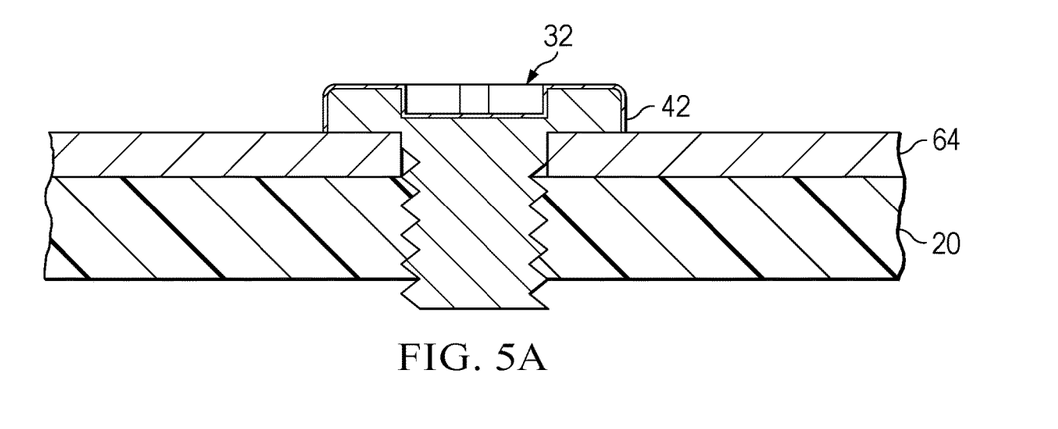

Referring now to FIGS. 5 and 5A, a support structure coupling device is depicted having a graphene paint applied to aid in thermal management. In the example embodiment, motherboard 20 has processing components coupled to it by screws 32, including a heat sink 60 that directs thermal energy away from a CPU 22 towards a thermal rejection system, such as a cooling fan that intakes and exhausts a cooling airflow through the housing interior. As is illustrated by FIG. 5A, graphene paint 42 applied to screws 32 and to securing hardware 64, such as a washer, improves thermal transfer at the coupling device. For instance, screw 32 accepts thermal energy from the air above motherboard 20 and directs the thermal energy to the base of motherboard 20, which may have a metal backing plate or copper ground.

Although the present invention has been described in detail, it should be understood that various changes, substitutions and alterations can be made hereto without departing from the spirit and scope of the invention as defined by the appended claims.

What is claimed is:

1. An information handling system comprising:
    a housing having an interior and exterior;
    a processor disposed in the housing interior and operable to execute instructions to process information;
    a memory disposed in the housing interior and interfaced with the processor, the memory operable to store the instructions and information;
    a support structure separate from and coupled with the housing, the support structure having a surface facing the housing interior; and
    graphene paint applied to the support structure at least where the support structure surface faces the housing interior; wherein the graphene paint varies in graphene content at different portions of the support structure surface based upon thermal conditions associated with the support structure.

2. The information handling system of claim 1 wherein the graphene paint varies in applied thickness at different portions of the support structure surface based upon thermal conditions associated with the support structure.

3. The information handling system of claim 1 further comprising:
    a battery disposed in the housing interior and interfaced with the processor and memory to provide power to execute the instructions, the battery having plural battery cells coupled within an outer casing;
    wherein the support structure comprises the battery outer casing and the graphene paint is applied to the battery outer casing.

4. The information handling system of claim 3 wherein the battery outer casing comprises a plastic material at an outer surface exposed to the housing interior.

5. The information handling system of claim 3 wherein graphene in the graphene paint has a varied graphene concentration based upon thermal characteristics of battery charge and discharge to promote a uniform temperature at the battery outer casing.

6. The information handling system of claim 5 wherein the varied graphene concentrations comprise plural different graphene paints applied to plural surface areas of the battery casing, each graphene having a varied concentration of graphene.

7. The information handling system of claim 5 wherein the varied graphene concentrations comprise plural thicknesses of the graphene paint applied to plural surface areas of the battery casing.

8. The information handling system of claim 1 further comprising:
    a keyboard coupled to an upper surface of the housing, the keyboard having plural keys to accept end user inputs; and
    a lattice coupled to the keyboard and having the support structure disposed between the keys; and
    wherein graphene paint is applied to the lattice support structure disposed between the keys.

9. A method for managing thermal energy at an information handling system interior, the method comprising:
    enclosing a processor, memory and a support structure inside a housing interior;
    applying graphene paint to the support structure;
    processing information with the processor and memory; and
    accepting thermal energy released by the processor at the graphene paint;
    wherein the applying graphene paint further comprises:
        applying a first graphene paint having a first graphene concentration to a first portion of the support structure; and
        applying a second graphene paint having a second graphene concentration at a second portion of the support structure, the second concentration different from the first concentration.

10. The method of claim 9 wherein the support structure comprises a battery casing, the method further comprising: applying the first concentration proximate a power interface connector of the battery; and applying the second concentration distal the power interface connector of the battery, the first concentration greater than the second concentration.

11. The method of claim 9 wherein the applying graphene paint further comprises:
    applying a first graphene paint thickness to a first portion of the support structure; and
    applying a second graphene paint thickness to a second portion of the support structure, the second thickness different from the first thickness.

12. The method of claim 11 wherein the support structure comprises a battery casing enclosing plural battery cells, the method further comprising:
    applying the first graphene paint thickness to the battery casing proximate the battery cells; and
    applying the second graphene paint thickness to the battery casing distal the battery cells, the first thickness greater than the second thickness.

13. The method of claim 9 further comprising: coupling the support structure to the housing interior with a screw; and applying the graphene paint to the screw before the coupling.

14. The method of claim 13 further comprising: applying the graphene paint to a keyboard lattice; and coupling the keyboard lattice to the housing interior with the keyboard lattice inserted over plural keys of a keyboard.

15. The method of claim 9 wherein the applying graphene paint further comprises:
    molding the support structure from plastic;
    painting the support structure with the graphene paint; and
    curing the graphene paint to 100 degrees Celsius.

16. A thermal management system comprising:
    plural battery cells operable to store and release an electric charge;
    a battery casing enclosing the battery cells; and
    graphene paint applied over the battery casing to accept thermal energy; wherein plural different graphene paints are applied to the battery casing, each graphene paint having a different concentration of graphene.

17. The thermal management system of claim 16 wherein plural different graphene paint thicknesses are applied to the battery casing at plural portion of the battery casing surface.

* * * * *